(12) United States Patent
Tabatowski-Bush (10) Patent No.: US 12,025,678 B2
(45) Date of Patent: Jul. 2, 2024

(54) COMMUNICATION INTERFERENCE AVOIDANCE AND PREDICTION

(71) Applicant: Ford Global Technologies, LLC, Dearborn, MI (US)

(72) Inventor: Benjamin A. Tabatowski-Bush, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 553 days.

(21) Appl. No.: 17/244,772

(22) Filed: Apr. 29, 2021

(65) Prior Publication Data

US 2022/0349953 A1 Nov. 3, 2022

(51) Int. Cl.
*G01R 31/58* (2020.01)
*G01R 31/56* (2020.01)
*H04Q 3/00* (2006.01)

(52) U.S. Cl.
CPC ............ *G01R 31/58* (2020.01); *G01R 31/56* (2020.01); *H04Q 3/00* (2013.01)

(58) Field of Classification Search
CPC .......... G01R 31/58; G01R 31/56; H04Q 3/00; H04B 3/46
USPC .................................. 340/2.1, 2.2, 4.2, 4.35
See application file for complete search history.

(56) References Cited

U.S. PATENT DOCUMENTS

| | | | | |
|---|---|---|---|---|
| 5,422,932 A * | 6/1995 | Kay | ...................... | H04W 24/00 370/337 |
| 8,483,730 B2 * | 7/2013 | Park | ...................... | H04W 72/00 455/501 |
| 10,776,231 B2 | 9/2020 | Buda et al. | | |
| 11,063,629 B1 * | 7/2021 | Bhupatiraju | ......... | H04B 17/364 |
| 2002/0067438 A1 * | 6/2002 | Baldock | ............. | H04N 21/4532 725/151 |
| 2009/0305713 A1 * | 12/2009 | Yamazaki | ........... | H04W 72/541 455/450 |
| 2011/0267476 A1 * | 11/2011 | Sakaguchi | ....... | H04N 21/64723 348/E5.009 |
| 2016/0299938 A1 * | 10/2016 | Malhotra | ............ | G06F 18/2433 |
| 2018/0294909 A1 * | 10/2018 | Trojer | .................... | H04J 11/004 |

FOREIGN PATENT DOCUMENTS

EP 3139313 A2 3/2017
WO WO-2020148773 A1 * 7/2020

OTHER PUBLICATIONS

Sandeep Chinchali et al., "Deep Learning for Wireless Interference Segmentation and Prediction", 2019, 5 pgs.
Teemu Pulkkinen et al., "Understanding WiFi Cross-Technology Interference Detection in the Real World", Dept. of Computer Science, University of Helsinki, Findland, 2020, 11 pgs.

* cited by examiner

*Primary Examiner* — Nam V Nguyen
(74) *Attorney, Agent, or Firm* — David B. Kelley; Brooks Kushman P.C.

(57) ABSTRACT

A controller transmits a message on a channel at a time the channel is predicted to be unoccupied according to a time ordered series of symbols. Each of the symbols represents a group of discrete time durations during which the channel has been occupied by a periodic signal and a corresponding feature of the periodic signal during the discrete time durations.

6 Claims, 4 Drawing Sheets

COMMUNICATION INTERFERENCE AVOIDANCE AND PREDICTION

TECHNICAL FIELD

This disclosure relates to the transmission and receipt of messages.

BACKGROUND

Data transmission and reception can take place over a point-to-point or point-to-multipoint communication channel. Examples of such channels include computer buses, copper wires, optical fibers, and wireless communication channels. The data are represented as an electromagnetic signal, an electric voltage, etc.

SUMMARY

A communication method includes receiving a time series signal indicative of occupancy of a channel, extracting features from the time series signal indicative of discrete time durations during which the channel is occupied and, for each of the discrete time durations, a number of edges of the signal, mapping each of the discrete time durations according to length and the number of edges to a symbol such that the discrete time durations having lengths falling within a first range and number of edges falling with a second range have a same symbol, predicting a time during which the channel will be vacant from a time ordered series of the symbols, and transmitting a message on the channel at the time during which the channel will be vacant.

A communication system includes a controller that transmits a message on a channel at a time the channel is predicted to be unoccupied according to a time ordered series of symbols. Each of the symbols represents a group of discrete time durations during which the channel has been occupied by a periodic signal and a corresponding feature of the periodic signal during the discrete time durations.

An automotive communication system includes a controller area network bus, and a controller that transmits a message on the controller area network bus at times the controller area network bus is predicted to be unoccupied according to a time ordered series of symbols. Each of the symbols represents a group of discrete time durations during which the controller area network bus has been occupied by a periodic signal.

DETAILED DESCRIPTION

Embodiments are described herein. It is to be understood, however, that the disclosed embodiments are merely examples and other embodiments may take various and alternative forms. The figures are not necessarily to scale. Some features could be exaggerated or minimized to show details of particular components. Therefore, specific structural and functional details disclosed herein are not to be interpreted as limiting, but merely as a representative basis for teaching one skilled in the art.

This disclosure assumes a domain in which radio transceivers share a common medium, and interference from one to the next is possible. Here we assume that the medium is a single channel, so that it is not possible to avoid interference by simply moving to another channel. We can think of our use case as that of a shared medium. There are numerous examples of communication on a shared medium, such as a controller area network (CAN) bus, Ethernet, and WiFi when transceivers are on the same channel. For a given WiFi channel, even if a transceiver switches channels, the channel is shared, and the desired channel may be occupied at the time the transceiver would like to utilize it. Therefore, almost all mediums are shared mediums (since the transmitters on both ends of the connection use the medium for transmitting) and the techniques for interference avoidance described herein are relevant. This work, among other things, targets interference avoidance in wireless powertrain or for radios for battery arrays for second life applications, but we can readily utilize data taken from the powertrain CAN bus from a vehicle to understand the basics of how interference avoidance works. This is convenient since today abundant data is available for CAN bus traffic between powertrain modules, and very little data is available on wireless powertrain networking.

Figure 1:
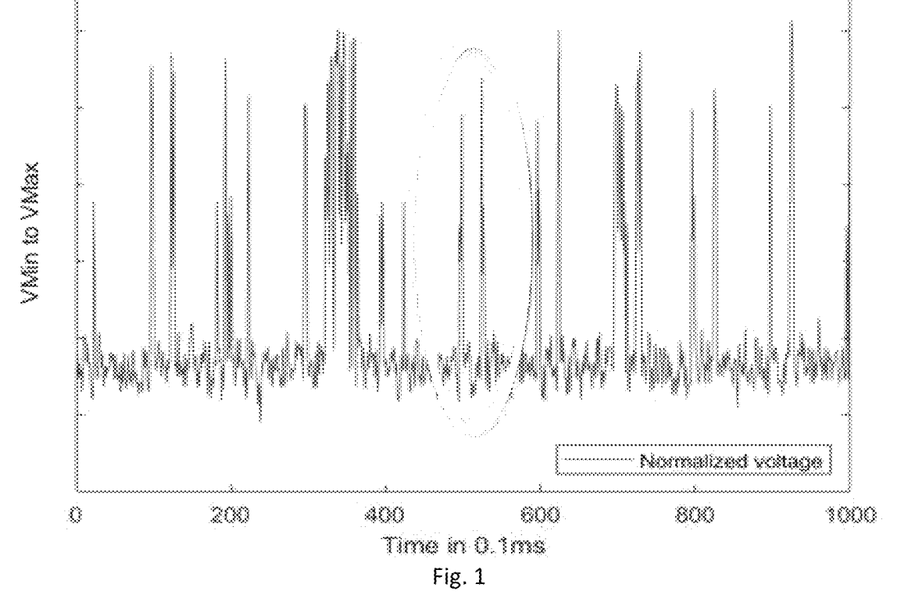
FIG. 1 is a plot of voltage versus time for a controller area network bus.

Referring now to FIG. 1, we show as an example the physical voltage on one node of a CAN bus from a powertrain vehicle CAN that includes a battery energy control module and other electrified controllers. This gives a good idea of the type of messaging traffic that we see on a powertrain bus. For this graph, a high value of voltage means some module is accessing the bus with CAN data, and a low value means the bus is inactive. This is an example of a continuous quantity that indicates the occupied status of a medium. When the voltage is above some threshold (for example 2.5V), the medium is occupied. Another example of a continuous quantity that indicates medium occupancy is the received signal strength indicator (RSSI.) An RSSI signal is often expressed in dBm or decibel milliwatts, or 10*log 10 (Po/1 milliwatt.) All the techniques here use CAN voltage as an example, but we can equally well apply the techniques to RSSI continuous signals by defining a threshold in dBm.

Referring to Table 1 below, we indicate a methodology for analyzing a continuous signal such as the CAN voltage from FIG. 1 or an RSSI signal, to identify periodic behavior and prepare for K-means clustering. Table 1 shows the output from certain signal processing steps which will be explained here, that take the continuous time signal and extract certain features from it, which will be useful later for the K-means clustering. This will show that via the use of K-means clustering and keeping track of timing, we can actually predict the periodic behavior of signals on the medium. By identifying particular signals or symbols (here, by identifying a Cluster # for each type of signal, e.g., Cluster 1, Cluster 2, and Cluster 3, also called symbols) and noting how far apart in time these symbols occur (see the timing values in milliseconds in rows labeled Cluster 1, Cluster 2, and Cluster 3 at the bottom of Table 1), we can find the period of the appearance of different symbols. This technique can directly lead to the ability to predict interference, since each periodically occurring symbol in fact can be considered an interference pattern.

TABLE 1

| Chunk timesteps | 0 | 26 | 40 | 65 | 30 | 25 | 27 | 32 | 27 | 0 |
|---|---|---|---|---|---|---|---|---|---|---|
| Falling edges | 1 | 2 | 4 | 7 | 2 | 2 | 2 | 6 | 2 | 1 |
| Cluster_start | 27 | 100 | 186 | 298 | 397 | 502 | 599 | 700 | 800 | 900 |
| Cluster # | 3 | 2 | 2 | 1 | 2 | 2 | 2 | 2 | 2 | 3 |
| Time in ms | 0 | 7.3 | 8.6 | 11 | 9.9 | 11 | 9.7 | 10 | 10 | 10 |
| Cluster 1 | 0 | 0 | 0 | 0 | 0 | 0 | 0 | 0 | 0 | 0 |
| Cluster 2 | 0 | 0 | 8.6 | 0 | 21 | 11 | 9.7 | 10 | 10 | 10 |
| Cluster 3 | 0 | 0 | 0 | 0 | 0 | 0 | 0 | 0 | 0 | 0 |

The way to read Table 1 is to observe that the time is increasing from left to right in the columns. The labelled rows (for example, Chunk Timesteps, Falling edges, etc.) each indicate a series of captured parameters over time. The simplest way to relate this table to the time signal is to look at the Chunk_start row, and observe that it monotonically increases from left to right. Observing FIG. 1, we notice the X-axis is labelled in 0.1 ms increments. The Chunk_start row is based on a time figure, but to get the time expressed in milliseconds, the time figure is multiplied by 0.1 ms. This methodology works with chunks and clusters. A chunk is a feature in the time domain data which starts with a rising edge and is followed by some number of rising and falling edges. Our definition of a chunk is that it starts with a single rising edge, and it extends until the time signal stays inactive for some duration. For the example here, the required inactive duration is 3 ms. This inactive duration can be any desired value as it is a calibratable quantity and depends on the nature of the data traffic we are observing. A simple idea is that for this example, the chunks are separated by 3 ms of inactivity, except possibly for the first and last chunk. Then, each chunk will consist of a rising edge followed by any number of rising and falling edges, up to the inactivity that defines the end of a chunk. A cluster is a chunk that has been identified by the K-means clustering algorithm and is assigned a symbol value, for example in Table 1, "Cluster #" row, values 1-3.

An algorithm to break the time series into chunks reads as follows:
Start at T=0;
Find the first rising edge—this is the start of the first chunk;
The chunk end is defined by the first instance of, for example, 3 ms of inactivity on the medium (the 3 ms of inactivity is not considered part of the chunk); and
The next chunk start will be after the inactive period that delineated the prior chunk.

For Table 1, the row entitled Chunk_start can be understood to mark the time moments for the start of each chunk as just defined. Notice that the row entitled Chunk timesteps gives the duration in timesteps (here, each valued at 0.1 ms) of the given chunk. Each column in Table 1 is a chunk, with the start moment located in the Chunk_start row, the duration of the chunk given in the Chunk timesteps row, the number of falling edges in the chunk listed in the Falling edges row, and the time in milliseconds from the present chunk start back to the prior chunk start listed in the Time in ms row.

Table 1 now contains the feature information needed for K-means clustering. Our approach for clustering requires two features to perform the technique. We choose the information in the Chunk timesteps row, which marks the duration in timesteps from the first rising edge to the last falling edge, as well the information in the Falling edges row. For example, the first column of Table 1 indicates that the first chunk starts at timestep 27 from the Chunk_Start row, and the two parameters are 0 for the Chunk timesteps parameter and 1 for the Falling edges parameter. The second chunk starts at timestep 100 and lasts 26 timesteps, with 2 falling edges, and so on.

Figure 2:
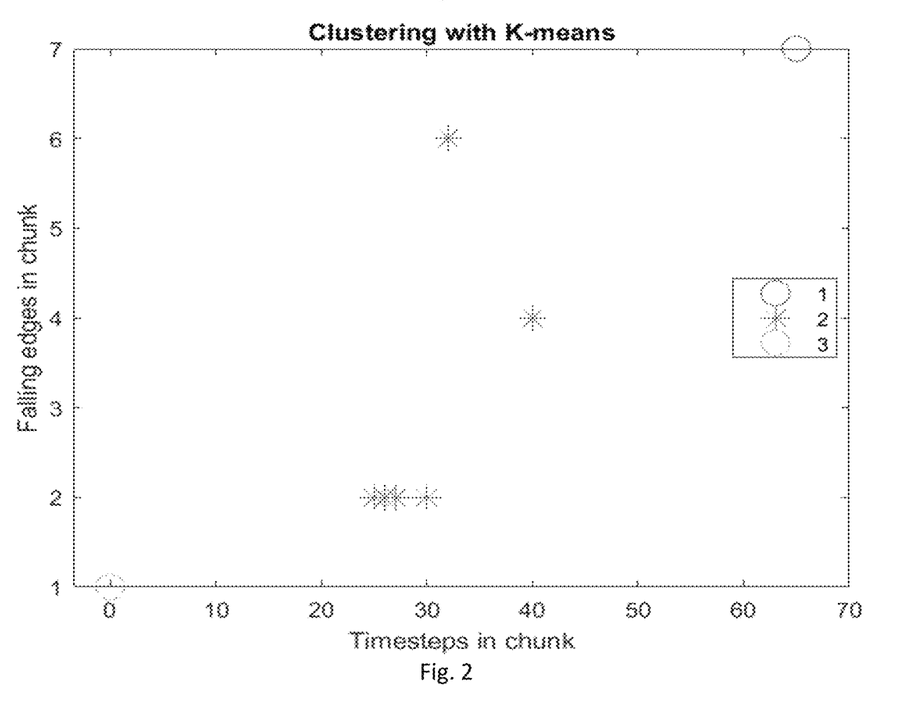
FIG. 2 is a K-means clustering result associated with the plot of FIG. 1.

Referring now to FIG. 2, we see the K-means clustering performed with K=3 for the data in Table 1. The K-means algorithm assigns what here is referred to as a cluster number for each chunk. A cluster number is simply which of the K categories that chunk gets assigned to. Since here K=3, the cluster number will range from 1 to 3. The same logic would apply for whatever number we use for K when we do the clustering. In FIG. 2, we see cluster 1 is in the upper right at 65 timesteps with 7 falling edges and is the largest chunk. Cluster 3 can be seen in the bottom left corner with 0 timesteps and 1 falling edge. It may seem strange to speak of chunks with zero timesteps, but if the pulse is very fast (see the first pulse on the left of FIG. 1) then the duration is very nearly zero, and with one falling edge. In FIG. 2, there are only one each of cluster 1 and cluster 3, but there are seven instances of cluster 2. Cluster 2 is spread throughout the middle of the K-means graph, varying from 26 to 40 timesteps long with 2 to 6 falling edges.

The value of performing the K-means clustering can be observed when we review the row titled Cluster # in Table 1. We see that through the K-means algorithm, each chunk is assigned a cluster number from 1 to 3. We may now refer to this cluster sequence as a symbol sequence, where the symbol number is given by the value in the Cluster # column. Each symbol in the sequence has a start time given by the value in the Chunk_start row in Table 1.

By the steps so far given, we have now transformed the time series shown in FIG. 1 with the symbol sequence given by rows Chunk_start and Cluster # in Table 1.

Figure 3:
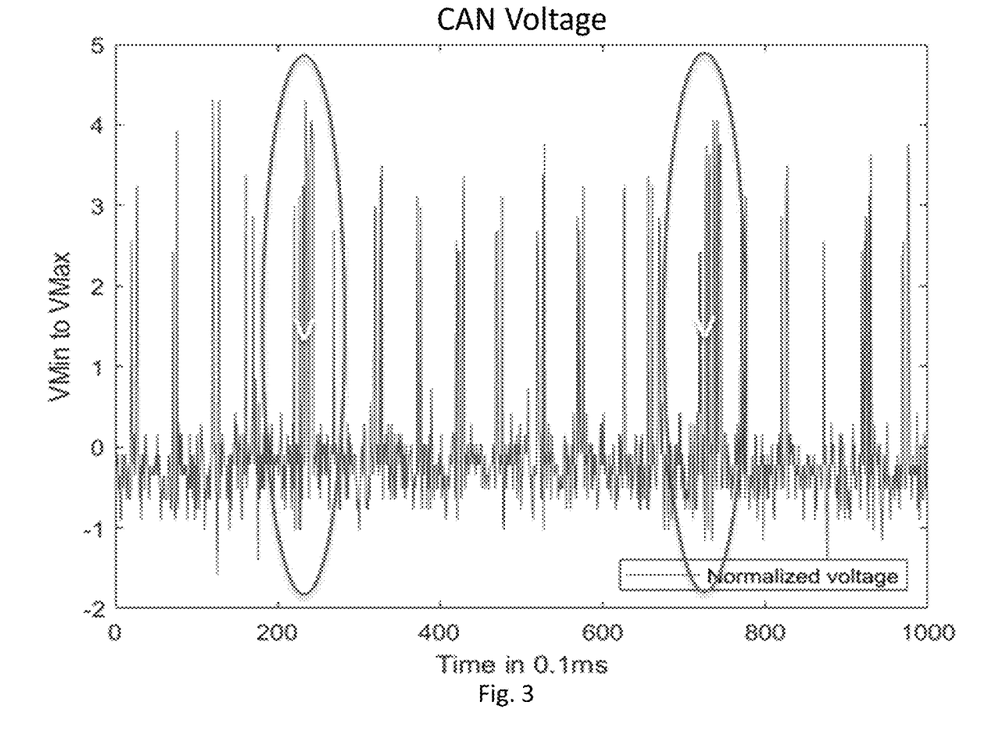
FIG. 3 is another plot of voltage versus time for a controller area network bus.

We switch to a different data set to explain period prediction. Notice that the operations explained so far were performed in the same way, and what we see in the Cluster # row is a different symbol sequence, because one can see that the underlying time series in FIG. 3 is different than the one in FIG. 1.

TABLE 2

| Chunk timesteps | 6 | 5 | 7 | 9 | 20 | 0 | 7 | 0 | 8 | 7 | 7 |
|---|---|---|---|---|---|---|---|---|---|---|---|
| Falling edges | 2 | 2 | 2 | 2 | 4 | 1 | 2 | 1 | 2 | 2 | 2 |
| Chunk_start | 24 | 75 | 124 | 165 | 224 | 273 | 323 | 376 | 424 | 473 | 523 |
| Cluster # | 1 | 1 | 1 | 1 | 2 | 3 | 1 | 3 | 1 | 1 | 1 |
| Time in ms | 0 | 10 | 9.8 | 8.2 | 12 | 9.8 | 10 | 11 | 9.6 | 9.8 | 10 |
| Cluster 1 | 0 | 10 | 9.8 | 8.2 | 0 | 0 | 32 | 0 | 20 | 9.8 | 10 |
| Cluster 2 | 0 | 0 | 0 | 0 | 0 | 0 | 0 | 0 | 0 | 0 | 0 |
| Cluster 3 | 0 | 0 | 0 | 0 | 0 | 0 | 0 | 21 | 0 | 0 | 0 |

| Chunk timesteps | 7 | 0 | 13 | 24 | 6 | 6 | 0 | 11 | 0 |
|---|---|---|---|---|---|---|---|---|---|
| Falling edges | 2 | 1 | 3 | 5 | 2 | 2 | 1 | 3 | 1 |
| Chunk_start | 573 | 630 | 660 | 723 | 774 | 824 | 876 | 923 | 973 |
| Cluster # | 1 | 3 | 1 | 2 | 1 | 1 | 3 | 1 | 3 |
| Time in ms | 10 | 11 | 6 | 13 | 10 | 10 | 10 | 9.4 | 10 |
| Cluster 1 | 10 | 0 | 17 | 0 | 23 | 10 | 0 | 20 | 10 |
| Cluster 2 | 0 | 0 | 0 | 100 | 0 | 0 | 0 | 0 | 100 |
| Cluster 3 | 0 | 51 | 0 | 0 | 0 | 0 | 49 | 0 | 49 |

Referring to FIG. 3, we will now explain a technique for using the K-means clustering results along with timing information to identify periodic information present in the test data set. The time series that describes the medium occupancy needs to have periodic behavior for us to be able to predict it. This is to say, we need to be able to find a pattern in the time series that repeats, and when we find this repeating pattern, we can predict the future of the time series. To be specific, if we can identify a symbol using the K-means clustering that repeats in time in a periodic fashion, then we now have the tool to predict this interference. To show a concrete example, we observe the two pulses circled in in FIG. 3. They correspond to symbol 2 in the Cluster # row in Table 2. In FIG. 3, now look at the row at the bottom labelled Cluster 2. Notice the value 100 below the second occurrence of symbol 2, in the column with Chunk_start 723. The way to interpret the values in the Cluster 2 column is it marks the time duration in milliseconds from the prior occurrence of symbol 2. The other Cluster n rows work the same way (here, there are three rows labelled Cluster 1, Cluster 2, and Cluster 3.) In Table 2, the rightmost column gives the summary results for all of the information in these three Cluster rows. The right column takes the median value of the non-zero information in these three Cluster rows. So for example, the median value of the nonzero values in the Cluster 1 row is 10, the median value from the Cluster 2 row is 100, the median value of the Cluster 1 row is 10 ms, and the median value of the Cluster 3 row is 49 ms. We now have detected a periodic 10 ms message on the CAN bus as Symbol 1, a 100 ms periodic message on the CAN bus as Symbol 2, and a message at about 49 ms as Symbol 3. So, just by using the techniques described so far (applying K-means clustering to certain parameters derived from a time series, and then observing the periodic behavior of the identified symbols) we can now identify periodic interference on a channel, and avoid it by transmitting at a time unoccupied by a periodic symbol transmission. We, however, will go further and demonstrate how to utilize a long short term memory (LSTM) to predict the future of the symbol sequence that we have captured.

To facilitate the LSTM training, we perform one additional step. The symbol sequence as shown in the Cluster # row of Table 2 does not contain any timing information. It merely gives the sequence of symbols. We can embed the timing information of the symbol sequence by adding a proportional number of zeros between each symbol in the symbol sequence based on the time between symbols, based on the timing information contained in the Chunk timesteps row of Table 2. In so doing, we now obtain a symbol sequence which also contains timing information.

Figure 4:
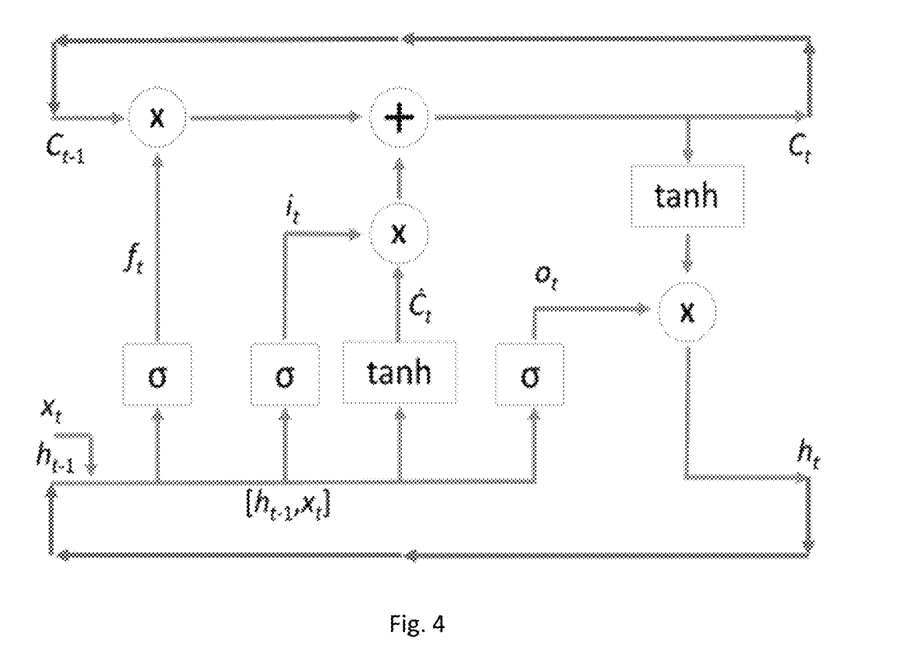
FIG. 4 is a block diagram of a long short term memory.

Referring to FIG. 4, $C_t$ is the present cell value, $C_{t-1}$ is the last cell value, "X" in a circle is a gate multiply by, "+" in a circle adds $$\sigma(x) = \frac{1}{1 + e^{-x}} \quad \tanh(x) = \frac{e^x - e^{-x}}{e^x + e^{1x}} \tag{1}$$

$$f_t = \sigma(W_f \cdot [h_{t-1}, x_t]^T + b_f) \tag{2}$$

$$i_t = \sigma(W_i \cdot [h_{t-1}, x_t]^T + b_i) \tag{3}$$

$$\dot{C}t = \tanh(W_c \cdot [h_{t-1}, x_t]^T + b_c) \tag{4}$$

$$O_t = \sigma(W_o \cdot [h_{t-1}, x_t]^T + b_o) \tag{5}$$

$$C_t = f_t * C_{t-1} + i_t * \dot{C}t \tag{6}$$

$$h_t = O_t * \tanh(C_t) \tag{7}$$

The forward pass step for the LSTM has the primary goal of creating the output function h_t based on the input and other values in the model. The input to our LSTM is x_t, which is a symbol sequence as developed by the K-means clustering. The forward pass is used to find the output of an LSTM to an input sequence x_t. There, however, is a preliminary step of training the LSTM. Software packages, such as MATLAB, can be used to train an LSTM. This training uses backwards propagation through time in order to properly set the weights in the LSTM equations.

We train an LSTM on a step-ahead predictor based on the XTest information as shown in the top row of Table 3. The test set here is a subset of the training set used (which came from the zero-added Cluster # row from Table 2. Tor illustration purposes, our test set here that comprises Xtest from Table 3 is a subset of the training set, and we purposefully selected the test set lined up with the start of a period from the training data, understanding that the training data is comprised of several periods of the same underlying periodic sequence. The reason to take care to align the start of the test data with a period start in the training data is because the LSTM is not able to make the prediction if we try to predict the sequence from the middle. Therefore, one consideration for using this technique on real world symbol sequences is that we need to have a means of extracting period information from the underlying timing information, and using the period information in extracting a test symbol sequence to feed into the LSTM for the forward pass.

Previously, we have explained how to find the period of underlying symbols. To provide an example of how this can be useful, we observe FIG. 3 to notice a symbol at 100 ms period (two chunks circled.) We can confirm this 100 ms period by reading the Cluster 2 row of Table 2 and noticing the column with a Chunk_start of 723. This marks the start of a 100 ms periodic sequence. So now that we have the ability to detect the start of a periodic sequence of specific length, we can go ahead and utilize the K-means clustering approach just described to gather the symbol sequence. Because of our knowledge of periodic behavior and with the ability to identify the longest period in the recorded data (in this example 100 ms,) we can now gather a training sample that is the length of whichever period we are interested in, and synchronize with the start of it. For the example shown in FIG. 3 and Table 3, the longest period is 100 ms for symbol 2, which we should take as the start and finish of our training sequence. We train our LSTM with the data selected with this specific start time and this specific duration. Later, when we take a new sampling of test data for which we wish to make predictions on, we also should select the start time at this symbol marking the longest period, with a record length as this longest period. By this technique, we take a symbol that appears in the data periodically and use it as a marker for both selecting the training sequence, and as well, to get the correct phasing and duration when we pick a test sequence.

TABLE 3

| X-Test | 1 | 0 | 1 | 0 | 0 | 0 | 1 | 0 | 0 | 0 | 1 | 0 | 0 | 0 | 2 | 0 | 0 | 0 | 3 | 0 | 0 | 0 | 1 | 0 | 0 | 0 | 3 | 0 | 0 | 0 |
|---|---|---|---|---|---|---|---|---|---|---|---|---|---|---|---|---|---|---|---|---|---|---|---|---|---|---|---|---|---|---|
| y-pred | -0 | .1 | -0 | 0 | .2 | .7 | .1 | -0 | -0 | .9 | -0 | -0 | -0 | 2.1 | .1 | 0 | -0 | 2.9 | -0 | -0 | -0 | 1.1 | .1 | -0 | .2 | 3 | -0 | .1 | -0 | .9 |

Figure 5:
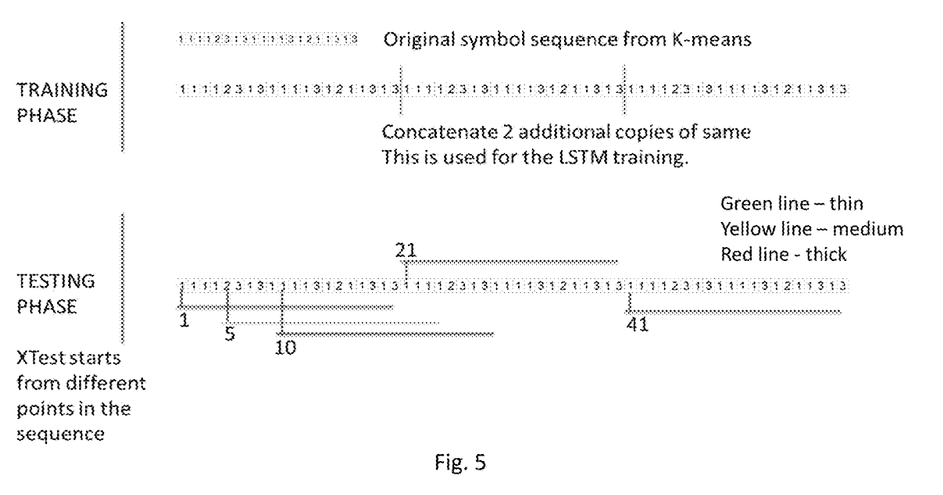
FIG. 5 is graph of training phasing for the long short term memory of FIG. 4.

The phasing of the test data relative to the training data helps the ability of the LSTM to predict the test sequence. Let us illustrate the point. We will utilize a symbol sequence that is not zero-added to include timing information, but the results are the same. Referring to FIG. 5, the top line shows an original symbol sequence from K-means clustering with three symbols (1-3.) This symbol sequence is the same as in Table 2. For the training of the LSTM, see the 2nd line labelled training phase in FIG. 5. It shows the concatenation of two additional copies of the original symbol sequence. This concatenated version of multiple copies of the original symbol sequence from K-means clustering is what we use to train the LSTM.

We now explain the concept of the phasing between the training symbol sequence and the test symbol sequence. We see in the training phase line that there are three copies of the original symbol sequence from K-means. A vertical line separates the three copies. Looking at the bottom line of FIG. 5, the line labelled testing phase shows five lines that are thin, medium, and thick. Lines 1, 21, and 41 are thin, line 5 is medium, and line 10 is thick. The line coding here has a relevance. Each line shows a length 20 test sequence. Here, the test sequence is exactly the same sequence as the original symbol sequence, but we can see the test sequence is phased differently with respect to the training sequence when we do the test of the LSTM performance. The number on each line gives the starting digit number from the training phase sequence. For example, the line labeled 1 starts on symbol number 1 from the training sequence, the line labeled 5 starts on symbol number 5 from the training sequence, and so on. Here, we will show the results from line 1, which turns out to be the same results as line 21 and 41. This is expected since the training sequence repeats at points 21 and 41 in the training sequence. We will also show the results from line 10.

Figure 6A:
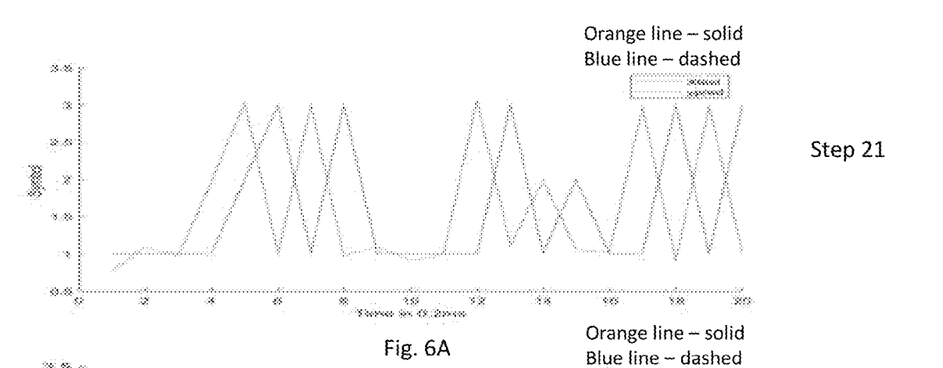
FIGS. 6A and 6B are plots of output of the long short term memory of FIG. 4
Figure 6B:
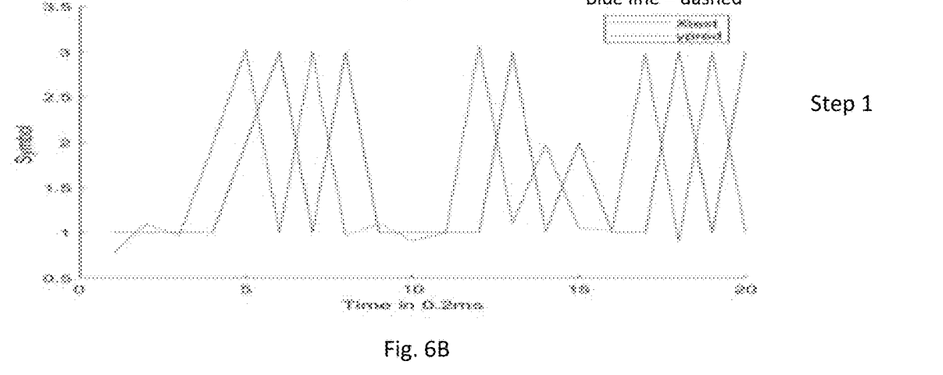

Referring to Table 4 and FIGS. 6A and 6B, we see the Xtest sequence which is the same as the original symbol sequence. We see the ypred which the trained LSTM prediction from inputting the test sequence. We show both the results for step 21 from FIG. 5 and step 1

TABLE 4

| | Step 21 | | | | | | | | | | | | | | | | | | |
|---|---|---|---|---|---|---|---|---|---|---|---|---|---|---|---|---|---|---|---|
| XTest | 1 | 1 | 1 | 1 | 2 | 3 | 1 | 3 | 1 | 1 | 1 | 1 | 3 | 1 | 2 | 1 | 1 | 3 | 1 | 3 |
| ypred | .8 | 1.1 | 1 | 2 | 3 | 1 | 3 | 1 | 1.1 | .9 | 1 | 3.1 | 1.1 | 2 | 1.1 | 1 | 3 | .9 | 3 | 1 |

TABLE 4-continued

| | Step 1 | | | | | | | | | | | | | | | | | | |
|---|---|---|---|---|---|---|---|---|---|---|---|---|---|---|---|---|---|---|---|
| XTest | 1 | 1 | 1 | 1 | 2 | 3 | 1 | 3 | 1 | 1 | 1 | 1 | 3 | 1 | 2 | 1 | 1 | 3 | 1 | 3 |
| ypred | .8 | 1.1 | 1 | 2 | 3 | 1 | 3 | 1 | 1.1 | .9 | 1 | 3.1 | 1.1 | 2 | 1.1 | 1 | 3 | .9 | 3 | 1 |

A couple of interesting things can be observed from FIGS. 6A and 6B. The results for step 21 and step 1 from FIG. 5 are the same, which is expected since the training sequence repeats. As well, we see the result in the solid ypred lines in the two graphs are predicting the symbol in the Xtest, one timestep ahead. We have thus taken a test sequence, which is a subset of the training sequence that was used to train an LSTM, and then feed the test sequence into the trained LSTM. When the phasing is correct as in this example, the forward pass of the LSTM predicts the symbol sequence. Now we will do an example where the phasing is not correct between our test set and the training set.

Figure 7:
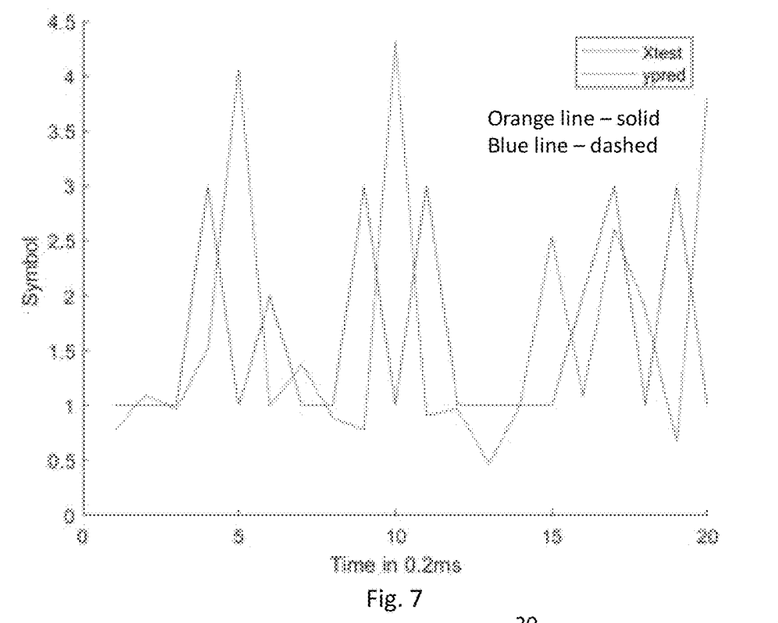
FIG. 7 is another plot of output of the long short term memory of FIG. 4.

Referring to Table 5 and FIG. 7, we see the solid ypred line of an LSTM that has been trained on the given training sequence from FIG. 5. This example corresponds to the thick line with label 10 in the testing phase section. Referring now to the graph in FIG. 7, we see there is very little relationship between the solid ypred line and the dashed Xtest line. The LSTM is not accurately predicting the symbol sequence. So now we have examples that demonstrate if we have a test symbol sequence which is "out of phase" with the sequence that was used to train the LSTM, we have poor prediction. If the test sequence bears a relationship to the training sequence (the same or slightly different) and is phased the same way as the training sequence, then we get good prediction results.

TABLE 5

| | Start XTest on step 10 | | | | | | | | | | | | | | | | | | |
|---|---|---|---|---|---|---|---|---|---|---|---|---|---|---|---|---|---|---|---|
| XTest | 1 | 1 | 1 | 3 | 1 | 2 | 1 | 1 | 3 | 1 | 3 | 1 | 1 | 1 | 1 | 2 | 3 | 1 | 3 | 1 |
| ypred | .8 | 1.1 | 1 | 1.5 | 4.1 | 1 | 1.4 | .9 | .8 | 4.3 | .9 | 1 | .5 | 1 | 2.5 | 1.1 | 2.6 | 1.9 | .7 | 3.8 |

We have thus demonstrated techniques for predicting interference, which directly enables our ability to avoid the interference. We start with a time series that indicates channel occupancy, which could be the voltage on a CAN bus, the RSSI value, or something similar. We apply specific techniques to extract two features from the time series, which here have been chunk duration and number of edges, although other measured features can work equally well as these. We then take a list of the chunks with measured features and apply it to a K-means clustering algorithm. This algorithm assigns symbol values to each cluster, and we organize this information along with the timing information from the parameterized data in order to identify the periodic behavior of the symbols. This already provides enough information to perform interference prediction and avoidance. We take a further step in order to predict future values of the symbol sequence. By using period information from the steps above, we identify the start and duration of both a training sequence for an LSTM, and later, a test sequence to feed as an input into the forward pass of an LSTM. The output prediction from the trained LSTM when fed this test sequence will predict future values of the symbol sequence. This future prediction of the symbol sequence can also be used to predict future interference, which we can avoid.

Figure 8:
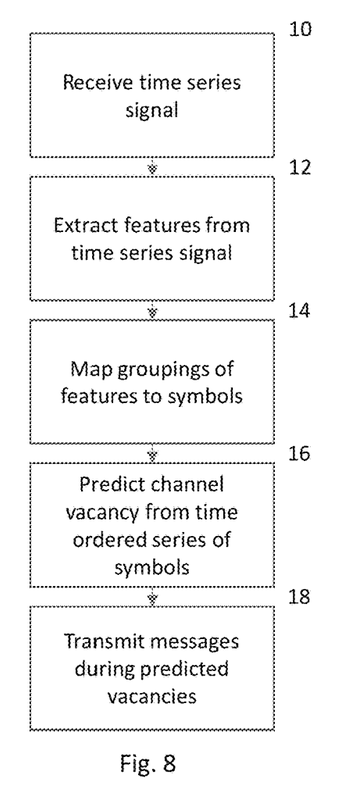
FIG. 8 is a flow chart of an algorithm for transmitting messages.

Referring to FIG. 8, a time series signal is received at operation 10. At operation 12, features are extracted from the time series signal. At operation 14, groupings of the features are mapped to symbols. At operation 16, channel vacancies are predicted from a time ordered series of the symbols. At operation 18, messages are transmitted during the predicted vacancies.

Figure 9:
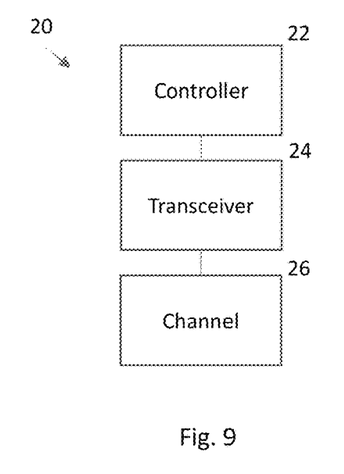
FIG. 9 is a schematic diagram of a communication system.

Referring to FIG. 9, a communication system 20 includes a controller 22, transceiver, 24, and channel 26, e.g., wired or wireless. The controller 22 may perform the operations described above to predict vacancies on the channel 26 and transmit messages thereon via the transceiver 24.

The algorithms, methods, or processes disclosed herein can be deliverable to or implemented by a computer, controller, or processing device, which can include any dedicated electronic control unit or programmable electronic control unit. Similarly, the algorithms, methods, or processes can be stored as data and instructions executable by a computer or controller in many forms including, but not limited to, information permanently stored on non-writable storage media such as read only memory devices and information alterably stored on writeable storage media such as compact discs, random access memory devices, or other magnetic and optical media. The algorithms, methods, or processes can also be implemented in software executable objects. Alternatively, the algorithms, methods, or processes can be embodied in whole or in part using suitable hardware components, such as application specific integrated circuits, field-programmable gate arrays, state machines, or other hardware components or devices, or a combination of firmware, hardware, and software components.

While exemplary embodiments are described above, it is not intended that these embodiments describe all possible forms encompassed by the claims. The words used in the specification are words of description rather than limitation, and it is understood that various changes may be made without departing from the spirit and scope of the disclosure. "Controller," for example, also contemplates "controllers." Received signal strength may be used instead of physical voltage for purposes of feature extraction. Moreover, the number of instances received signal strength exceeds a predefined value during a chunk, or the longest time between adjacent rising or adjacent falling edges during a chunk may be used instead of the number of falling (or rising) edges of the signal during the chunk for purposes of feature extraction.

As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A communication method comprising:
    receiving a time series signal indicative of occupancy of a channel;
    extracting features from the time series signal indicative of discrete time durations during which the channel is occupied and, for each of the discrete time durations, a number of edges of the time series signal,
    mapping each of the discrete time durations to one of a plurality of symbols according to length and the number of edges such that the discrete time durations having lengths that fall within a first range of values and number of edges that fall within a second range of values are mapped to a same one of the plurality of symbols;
    predicting a time during which the channel will be vacant from a time ordered series of the plurality of symbols; and
    transmitting a message on the channel at the time during which the channel will be vacant.

2. The communication method of claim 1, wherein the time series signal indicative of occupancy is a voltage versus time signal.

3. The communication method of claim 1, wherein the time series signal indicative of occupancy is a received signal strength versus time signal.

4. The communication method of claim 1, wherein the number of edges is the number of falling edges.

5. The communication method of claim 1, wherein the predicting includes measuring time between same symbol appearances in the time ordered series of the symbols.

6. The communication method of claim 1, wherein the predicting includes training a model of symbol timing on the time ordered series of symbols.

* * * * *